US009490385B2

(12) United States Patent
Huang et al.

(10) Patent No.: US 9,490,385 B2
(45) Date of Patent: Nov. 8, 2016

(54) DEVICES INCLUDING INDEPENDENTLY CONTROLLABLE ABSORPTION REGION AND MULTIPLICATION REGION ELECTRIC FIELDS

(75) Inventors: Zhihong Huang, Palo Alto, CA (US); Marco Fiorentino, Mountain View, CA (US); Charles M. Santori, Palo Alto, CA (US); Zhen Peng, Foster City, CA (US); Di Liang, Santa Barbara, CA (US); Raymond G. Beausoleil, Redmond, CA (US)

(73) Assignee: Hewlett Packard Enterprise Development LP, Houston, TX (US)

( * ) Notice: Subject to any disclaimer, the term of this patent is extended or adjusted under 35 U.S.C. 154(b) by 23 days.

(21) Appl. No.: 14/402,704

(22) PCT Filed: May 29, 2012

(86) PCT No.: PCT/US2012/039866
§ 371 (c)(1),
(2), (4) Date: Nov. 21, 2014

(87) PCT Pub. No.: WO2013/180690
PCT Pub. Date: Dec. 5, 2013

(65) Prior Publication Data
US 2015/0108327 A1   Apr. 23, 2015

(51) Int. Cl.
*H01L 31/107*   (2006.01)
*H01L 31/0224*   (2006.01)
(Continued)

(52) U.S. Cl.
CPC .............. *H01L 31/107* (2013.01); *G02B 6/42* (2013.01); *H01L 31/028* (2013.01);
(Continued)

(58) Field of Classification Search
CPC ..... H01L 21/00; H01L 21/18; H01L 31/105; H01L 31/107; H01L 31/109; H01L 31/072; H01L 31/078
See application file for complete search history.

(56) References Cited

U.S. PATENT DOCUMENTS 6,724,063 B2   4/2004   Kuhara et al.
6,794,631 B2   9/2004   Clark
(Continued)

FOREIGN PATENT DOCUMENTS

CN   1858916        11/2006
CN   1905216 A       1/2007
(Continued)

OTHER PUBLICATIONS

Gramsch et al., Performance of a Junction Termination Extension Avalanche Photodiode for Use with Scintillators, XV Chilean Physics Symposium, 2006, Journal of Physics: Conference Series 134 (2008) 012022, IOP Publishing 2008, 4 pages.
(Continued)

*Primary Examiner* — Kyoung Lee
(74) *Attorney, Agent, or Firm* — Hewlett Packard Enterprise Patent Department

(57) ABSTRACT

A device includes a first region, a multiplication region, a second region, and an absorption region. The first region is associated with a first terminal, and the second region is associated with a second terminal. The first region is separated from the second region by the multiplication region. The absorption region is disposed on the multiplication region and associated with a third terminal. A multiplication region electric field is independently controllable with respect to an absorption region electric field, based on the first terminal, the second terminal, and the third terminal.

15 Claims, 8 Drawing Sheets

(51) Int. Cl.
    *H01L 31/105*     (2006.01)
    *G02B 6/42*     (2006.01)
    *H01L 31/028*     (2006.01)
    *H01L 31/0352*     (2006.01)

(52) U.S. Cl.
    CPC ........... *H01L 31/022408* (2013.01); *H01L 31/03529* (2013.01); *H01L 31/035281* (2013.01); *H01L 31/105* (2013.01); *H01L 31/1075* (2013.01); *Y02E 10/547* (2013.01)

(56) References Cited

U.S. PATENT DOCUMENTS

| | | |
|---|---|---|
| 7,259,408 B2 | 8/2007 | Yagyu et al. |
| 7,397,101 B1 | 7/2008 | Masini et al. |
| 7,453,131 B2 | 11/2008 | Marshall et al. |
| 7,795,639 B2 | 9/2010 | Rothman |
| 2002/0066938 A1 | 6/2002 | Pauchard et al. |
| 2006/0251375 A1 | 11/2006 | Morse |
| 2006/0289957 A1* | 12/2006 | Morse .................. H01L 31/028 257/438 |
| 2008/0017883 A1 | 1/2008 | Sarid et al. |
| 2009/0257703 A1 | 10/2009 | Bratkovski et al. |
| 2012/0126286 A1* | 5/2012 | Na .......................... H01L 31/105 257/186 |

FOREIGN PATENT DOCUMENTS

| | | |
|---|---|---|
| JP | 61170079 A | 7/1986 |
| TW | 200814346 A | 3/2008 |
| WO | WO-0190802 | 11/2001 |
| WO | WO-2008066696 A2 | 6/2008 |
| WO | WO-2011083657 | 7/2011 |

OTHER PUBLICATIONS

Lei et al., Based Simulation of High Gain and Low Breakdown Voltage InGaAs/InP Avalanche Photodiode [online], Sep. 2008, IEEE, Retrieved fro, the Internet <http://ieeexplore.ieee.org/xpl/freeabs_all.jsp?arnumber=4668230> [retrieved on Feb. 7, 2013], 2 pages.

PCT International Search Report & Written Opinion, Jan. 21, 2013, PCT Patent Application No. PCT/US2012/039866, 11 pages.

Extended European Search Report received in EP Application No. 12877675.4, Jan. 27, 2016, 10 pages.

* cited by examiner

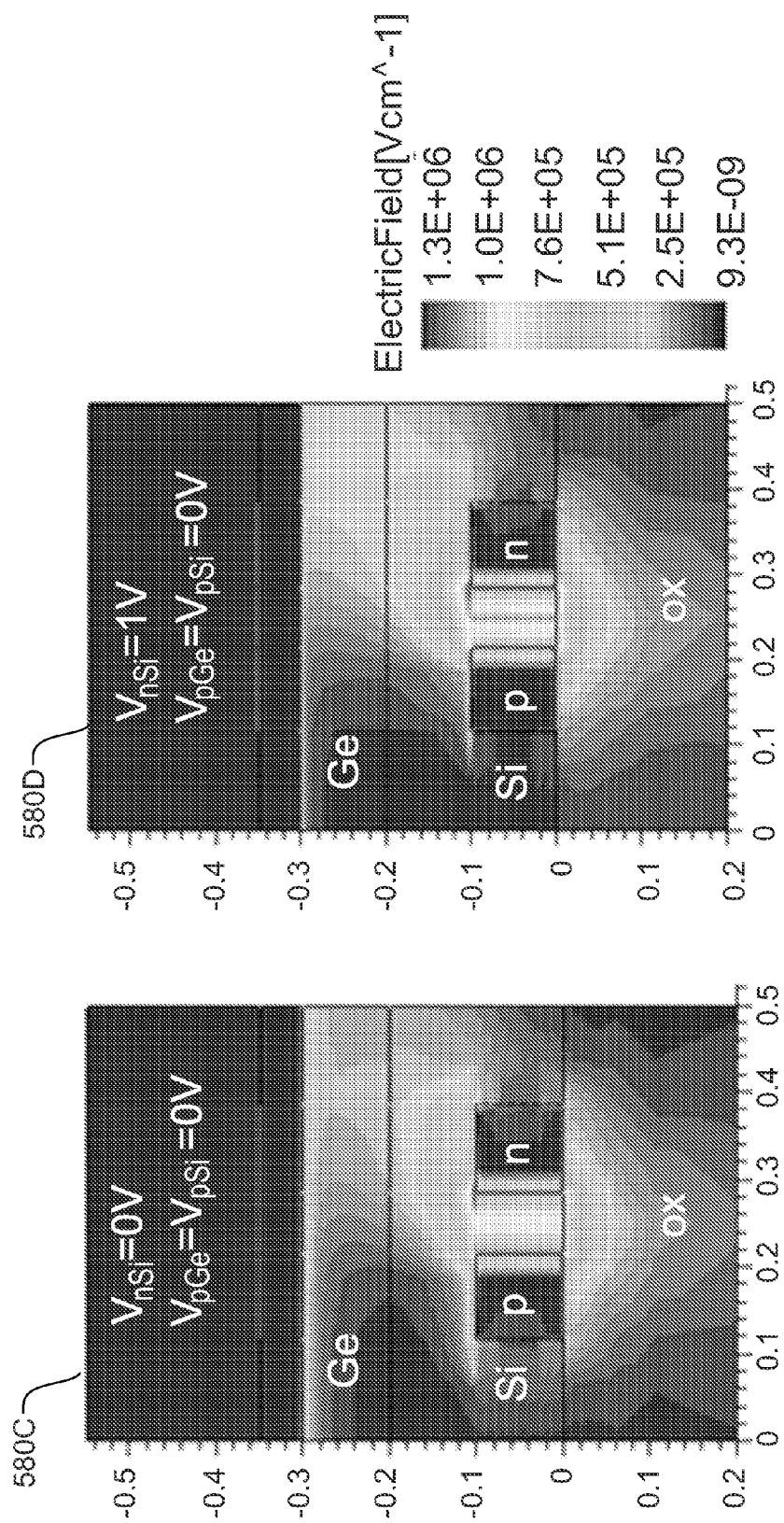

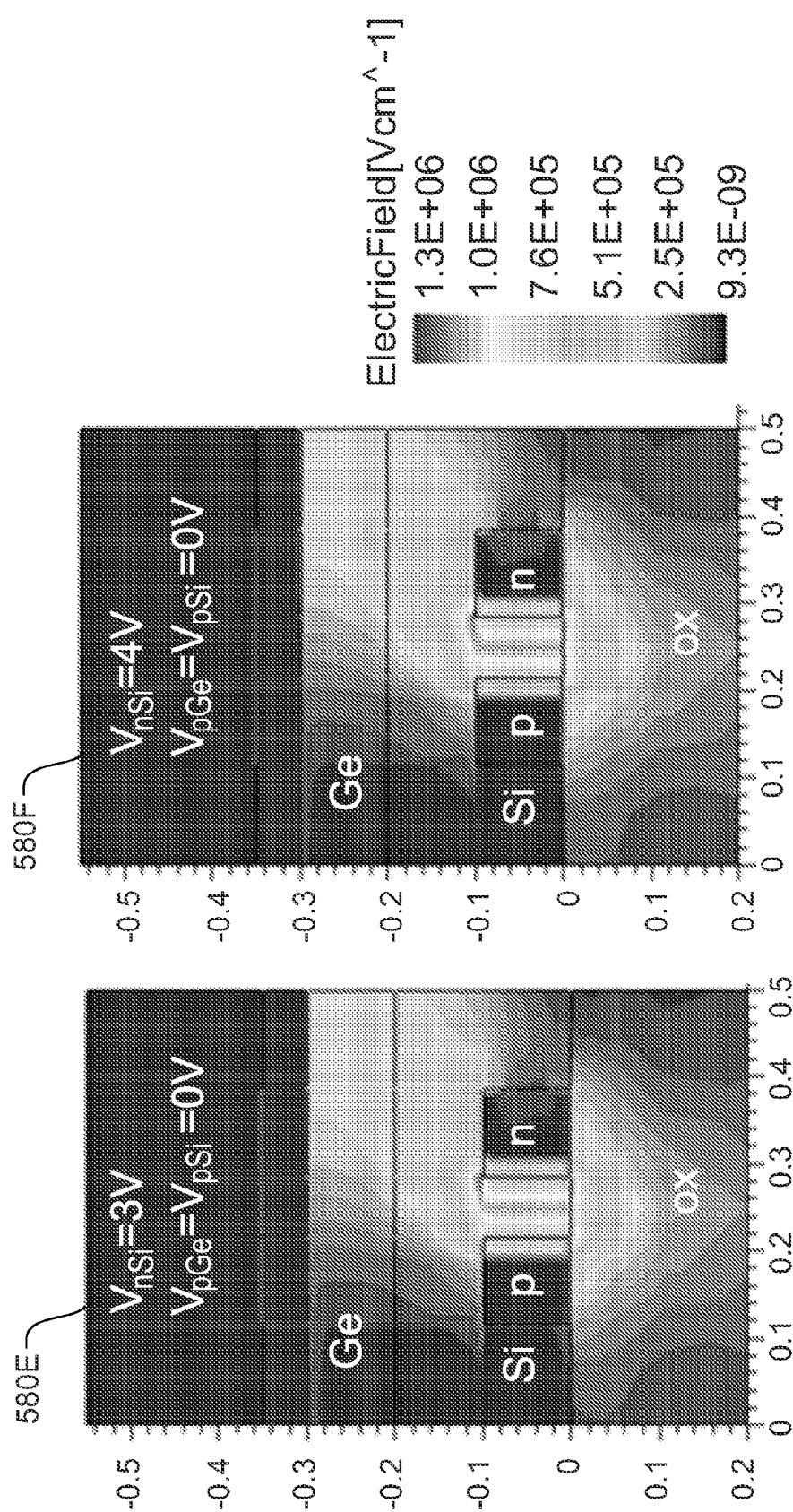

DEVICES INCLUDING INDEPENDENTLY CONTROLLABLE ABSORPTION REGION AND MULTIPLICATION REGION ELECTRIC FIELDS

BACKGROUND

Photodetection devices may use complicated architecture based on a high doping and high operational electric field and voltage. A charge region may form part of a vertically arranged serial transition layer structure using a very high breakdown voltage resulting in high operational voltage use. Furthermore, the various layers of the serial structure are associated with being defined and controlled very precisely, resulting in a need for particularized doping or other techniques to obtain a viable structure.

An avalanche photodiode is a highly sensitive photodetector which has internal gain through avalanche multiplication. Avalanche photodiodes have been traditionally used for long haul optical communications; for a given data transfer rate, they can provide 10× better sensitivities than a PIN diode, for example. APDs can use normal incident light and can use a waveguide structure to couple incident light. For materials with lower absorption efficiency, such as Ge or quantum dots etc., a long absorption length/size may be needed to provide sufficient quantum efficiency. As a result of the long length/large size, traditional APDs may be bulky and have high dark current, low quantum efficiency, and low bandwidth. Additionally, large device size and high power consumption can be particularly detrimental for on-chip optical interconnect applications. Furthermore, traditional APDs may use separate absorption charge multiplication (SACM) design, which may result in high breakdown voltage (typically >25V for GeSi APDs) due to the serial placement of each region.

BRIEF DESCRIPTION OF THE DRAWINGS/FIGURES

FIGS. 5C-5F are side view block diagrams of a device showing electric field strength as a function of bias on n-Si according to an example.

DETAILED DESCRIPTION

Example devices described herein, such as avalanche photodiodes (APDs) to detect light, can take advantage of three terminals for low breakdown voltage, and resonant enhancement (e.g., based on a microring) to effectively increase an optical absorption path while maintaining small size, to achieve high quantum efficiency, low dark current, low breakdown voltage, and low power consumption. Benefits may be achieved without the use of existing APD structures, such as a separate absorption charge multiplication (SACM) design, and without the associated high driving voltages (e.g., greater than 25 volts for a SACM germanium silicon (GeSi) device) and associated complicated fabrication process (such as precise charge layer doping control). Example devices described herein can have a small form factor, low power consumption (e.g., operational voltages of approximately 5-12 volts), low cost, and may be used for on-chip optical interconnects on photonics platforms and other high bandwidth, small cross-talk and low power consumption applications. Additionally, example devices can be fabricated based on, and compatible with, Complementary Metal Oxide Semiconductor (CMOS) fabrication techniques.

Figure 1:
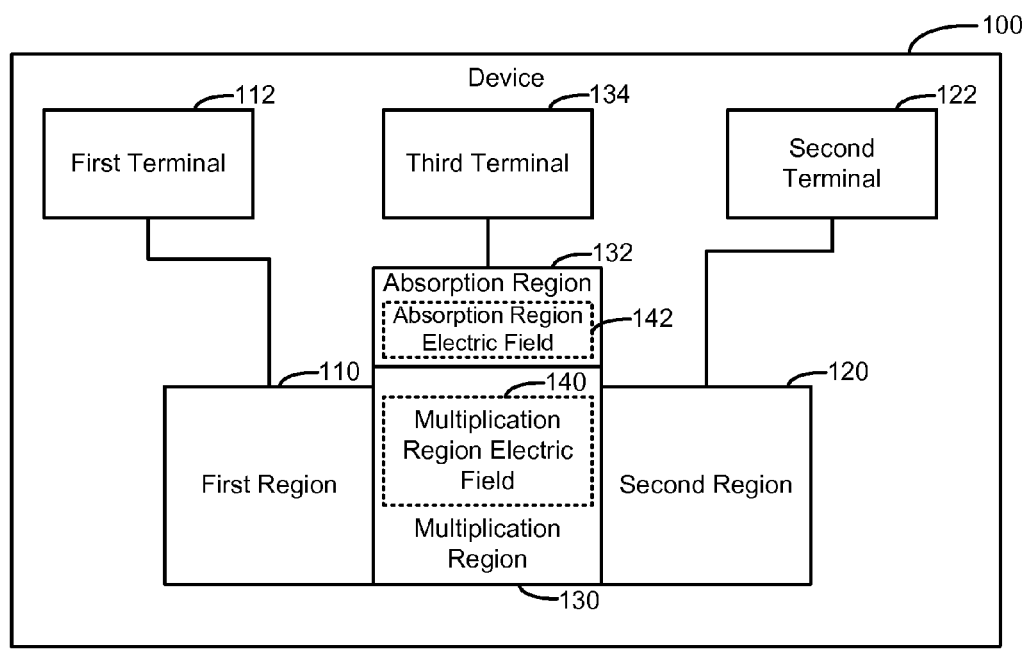
FIG. 1 is a side view block diagram of a device including a multiplication region according to an example.

FIG. 1 is a side view block diagram of a device 100 including a multiplication region 130 according to an example. The device 100 further includes a first region 110 associated with a first terminal 112, and a second region 120 associated with a second terminal 122 and separated from the first region 110 by the multiplication region 130. An absorption region 132 is disposed on the multiplication region 130, and associated with a third terminal 134. A multiplication region electric field 140 is associated with the multiplication region 130, and an absorption region electric field 142 is associated with the absorption region 132.

The device 100 can detect light based on absorbing light and generating an electrical signal. The absorption region 132 is to absorb photons and generate electrical carriers, and the multiplication region 130 is to avalanche multiply the generated carriers, and sweep the carriers to the first region 110 and/or the second region 120. The device 100 may use first terminal 112, second terminal 122, and third terminal 134 to affect the generation and/or multiplication of carriers, e.g., by independently controlling the absorption region electric field 142 and the multiplication region electric field 140.

The absorption region electric field 142 may be controlled independently from the multiplication region electric field 140, to move carriers from the absorption region 132 to the multiplication region 130. The multiplication region electric field 140 may be adjusted to exceed a threshold for impact ionization of carriers, which may result in avalanche multiplication in the multiplication region 130, while remaining below a breakdown voltage level. A strength of the absorption region electric field 142 may be below a strength of the multiplication region electric field 140. Thus, device 100 illustrates two parallel-controllable electric fields, enabling independent and separate control of the absorption region 132 and the multiplication region 130, based on driving voltages through the first terminal 112, second terminal 122, and third terminal 134. The absorption region electric field 142 can be low, to drive photo-generated electric carriers to the multiplication region 130. The multiplication region electric field 140 can extend laterally between the first region 110 and second region 120, to separate the carriers and/or trigger avalanche multiplication to detect electric current.

The independently controllable fields may be enabled for absorption region 132 and multiplication region 130 based on the terminals, without needing multiple, separately doped layers within a region. Thus, unlike a SACM-based design, a region does not need to be modified using precisely-controlled doping to create a charge layer. The device 100 may be based on materials such as silicon for a multiplication region and germanium for an absorption region, without needing, e.g., a carefully-grown multi-layer III-V structure associated with a region. Silicon provides advantages such as compatibility with Si CMOS process, and its low impact ionization coefficient (k-value) compared to other III-V materials (e.g., 0.02 for Si vs. 0.2 for InGaAlAs).

Additionally, in an example provided in the present application, the carriers do not need to travel through a barrier to the multiplication region 130. In contrast, for an existing SACM APD at low bias, an electric field may build up in a multiplication region based on a bias. Then most of the bias drops on a charge layer to compensate the charges doped in the applicable region, according to the expression $dQ=CdV$ (where dQ is change in charge, C is capacitance, and dV is change in voltage). Thus, in the SACM APD, after balancing the charge layer, the multiplication region electric field can start to penetrate into the absorption region. Without an electric field in the absorption region of the SACM APD, the photo generated carriers may not travel to the multiplication to be collected. Accordingly, the SACM APD needs very high voltage to operate. For example, a high operating voltage using this scheme may be 25-30V for a GeSi APD.

Thus, in contrast to the SACM APD, for example, operation at much lower operational and/or breakdown voltages (e.g., on the order of ten of volts) can be achieved in the examples of the present application. Furthermore, the breakdown voltage can depend on the distance between the first region 110 and the second region 120. By shrinking the distance between the first region 110 and the second region 120 to a few hundred nanometers, for example, gain multiplication can occur by applying just a few volts. Therefore, small size, high quantum efficiency, low dark current, low breakdown voltage and low power consumption devices can be achieved which is suitable of on-chip optical interconnect applications.

The device 100 can take advantage of a resonance enhancement to effectively increase an optical absorption path associated with the absorption region 132, while keeping the device size small (within a few microns). For example, the device 100 may include an absorption region 132 and/or other regions/features based on a microring resonance cavity. Other geometries and/or types of resonance cavities are possible, such as non-ring and/or linear resonators based on Fabry Perot reflectors and other techniques.

The first region 110, second region 120, multiplication region 130, and other regions/elements may be formed by doping, e.g., selectively doping a silicon substrate with appropriate materials. In an example, the first region 110 may be designated as being p-doped, and the second region 120 may be designated as being n-doped, although the p-doped and n-doped regions can be interchanged or formed in other ways.

The device 100 may be formed of various materials, such as silicon (Si), germanium (Ge), SiGe, various oxides, and other materials (e.g., metals for the terminals). In an example, the multiplication region 130 is can be Si, and the absorption region 132 can be Ge or SiGe. SiGe may provide a lower absorption coefficient but higher quality factor (Q) than Ge, and a lower lattice mismatch with the Si of the multiplication region 130, which may reduce the optical loss at the Si/SiGe interface. Thus, an absorption region 132 having a lower absorption coefficient may enable the multiplication region 130 to couple available light (e.g., from a waveguide) more readily than the absorption region 132, thereby avoiding negative effects to the coupling of the multiplication region 130 to a waveguide etc. Other low impact ionization coefficient (low-K) materials also may be used, such as aluminum phosphate.

The first terminal 112, second terminal 122, and third terminal 134 can be made out of a variety of contact materials, such as aluminum and/or copper. A highly doped portion (not shown) can be formed in/on the first region 110, second region 120, and/or absorption region 132 to make better ohmic contact with the terminals. The terminals may have various alternative geometries and attachment locations in alternate examples, to accommodate manufacturing considerations, to alter the electrical field characteristics, to more efficiently collect the charges generated, and for other considerations.

Figure 2:
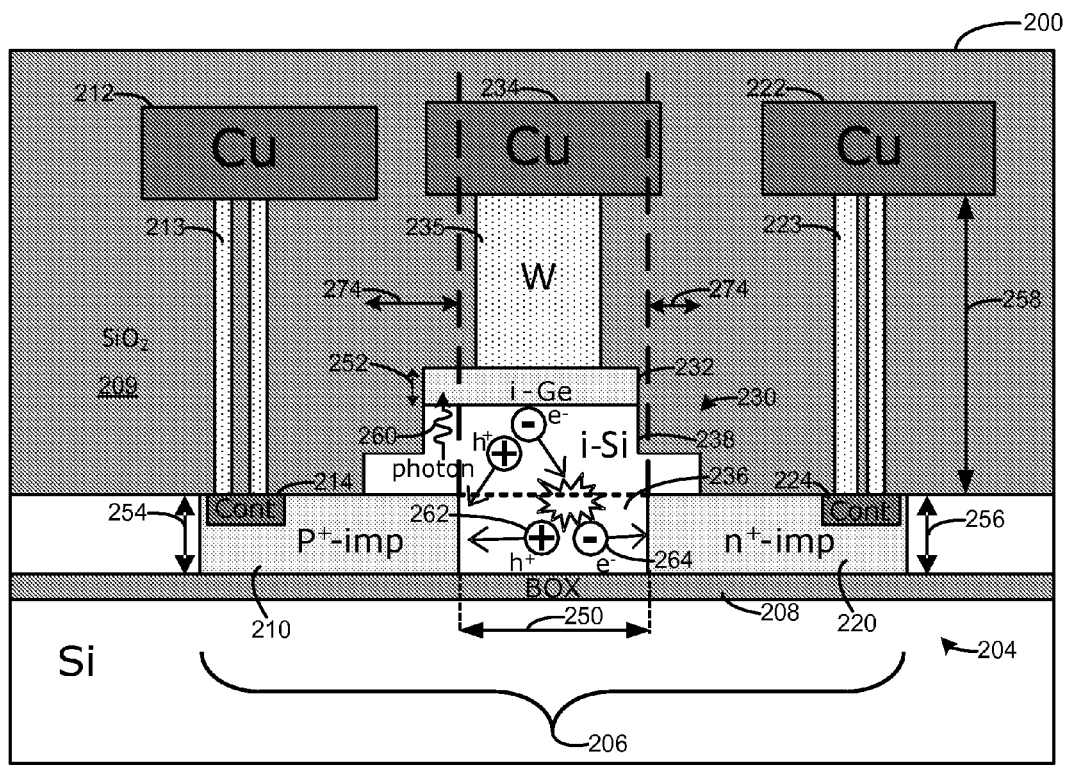
FIG. 2 is a side view block diagram of a device including a multiplication region according to an example.

FIG. 2 is a side view block diagram of a device 200 including a multiplication region 230 according to an example. Device 200 includes a substrate 204. First region 210 is associated with first terminal 212 based on first region contact 214 and via 213. Second region 220 is similarly associated with second terminal 222 based on second region contact 224 and via 223. The terminals are shown as copper (Cu), and may be other metals and/or materials. The multiplication region 230 includes a first portion 236 and a second portion 238. The absorption region 232 is disposed on the second portion 238 of the multiplication region 230, and is associated with third terminal 234 based on via 235 (an absorption region contact, not shown, also may be associated with the absorption region 232). The first region contact 214 and second region contact 224 may be higher doped portions of the first region 210 and second region 220, and vias 213, 223, and 235 may be tungsten (W) or other metal.

Substrate 204 is shown as a silicon-on-insulator (SOI) substrate, including a buried oxide (BOX) layer 208, and may be based on other types of semiconductor material. The first region 210, first portion 236 of the multiplication region 230, and second region 220 may be formed in substrate 204, e.g., based on ion implantation or other techniques. The first region 210, multiplication region 230, and second region 220 may form a junction based on P-type material, Intrinsic semiconductor material, and N-type material, e.g., a PIN junction 206. The intrinsic semiconductor material may be formed from the underlying substrate material such as silicon or other semiconductors, and/or near-intrinsic low-doped material that may be approximated by a high-resistivity p layer, a high-resistivity n layer, or other materials. The first region 210, first portion 236 of the multiplication region 230, and second region 220 may extend to various depths into the substrate 204, including extending to the BOX layer 208. A first region thickness 254 and second region thickness 256, as well as a thickness of first portion 236 of the multiplication region 230, may be approximately 250 nm in an example. The first region 210 may be separated from the second region 220 based on a separation distance 250 of approximately 400-600 nm in an example. However, all thicknesses/distances specifically mentioned herein may be scaled and/or adjusted in alternate examples.

A second portion 238 of the multiplication region 230 is disposed on the first portion 236 of the multiplication region 230. The second portion 238 may have a thickness of approximately 50-100 nm in an example. Thus, an effective thickness of the multiplication region 230 may be approximately 300-350 nm in an example. The absorption region 232 is disposed on the second portion 238, and may have an absorption region thickness 252 of approximately 100 nm in an example. Device 200 also may include an oxide 209, such as Silicon Dioxide ($SiO_2$), disposed on the substrate 204, multiplication region 230, and absorption region 232. The oxide 209 may provide a supporting and isolating function, e.g., based on an oxide thickness 258 to address capacitance between the first terminal 212, second terminal 222, third terminal 234, and substrate 204. Various portions of the device 200 may be disposed relative to the first portion 236 of the multiplication region 230 with an overlap 274 with the first region 210 and/or the second region 220. For example, a portion of the second portion 238 of the multiplication region 230 may overlap beyond the separation distance 250, while a portion may not overlap (e.g., based on a stepped-geometry having narrower and a wider portions).

Geometries of various regions may be varied. The absorption region 232 and second portion 238 of the multiplication region 230 can be varied to enable low dark current and/or low capacitance. The second portion 238 may include a step-shape as illustrated, such that the second portion 238 laterally extends further than the absorption region 232. The absorption region 232 may have a smaller area and thickness, e.g., compared to other regions. Geometries of the first region 210 and/or the second region 220 may be varied, including reducing the separation distance 250 between the regions to achieve a low avalanche breakdown voltage. The shape of the multiplication region 230 may be varied in view of the refractive index of the various regions. For example, an absorption region 232 made of Ge may have a higher refractive index than a multiplication region 230 made of Si, potentially affecting mode confinement among the regions such that the stepped-shape is to reduce mode/half-mode confinement in the Ge absorption region 232. Other region geometries can be adjusted, to address how the modes are confined in a given region.

Geometries also may be adjusted to reduce operational voltages. A stepped shape for the multiplication region 230 may enable and/or affect mode confinement associated with the multiplication region 230. The separation distance 250 may be chosen to control breakdown voltage, such as to prevent tunneling breakdown and encourage avalanche multiplication. The distance between the absorption region 232 and the first/second regions 210, 220 may be chosen to avoid a high electric field penetrating into the absorption region 232, to avoid impact ionization and/or avalanche multiplication in the absorption region 232.

Geometries such as a stepped shape can change the effective index of a region to increase mode coupling, such as enhancing mode coupling in Si and Ge (or other materials) having different refractive indexes, and facilitating light coupling based on geometry, in a material that is less likely to couple based on the intrinsic material. Other mode coupling shapes and materials are possible, including materials where the multiplication region 230 has a higher index than the absorption region 232. The absorption region 232 may be structured with a geometry to avoid coupling to a waveguide, and may have a geometry (in conjunction with the geometry of the multiplication region 230) to effectively situate the absorption region 232 further away from a waveguide (e.g., less of a lateral extension of absorption region 232 than multiplication region 230). The region geometries may provide other functions, such as the stepped-structure of the multiplication layer 230 preventing an optical field of a waveguide from overlapping the via 235 by physically spacing the waveguide from the via 235. In addition to a stepped-structure, ramps, curves, slants, or other geometries may be used to provide various benefits. In alternate examples, regions may be omitted. For example, second portion 238 of the multiplication region 230 may be omitted, such that absorption region 232 is disposed on the first portion 236 of the multiplication region 230.

The vias and terminals can be various metals including aluminum, besides the Cu and W shown. Geometries of the vias and terminals may be varied, including varying widths and numbers. In the illustrated example, via 213 and via 223 are shown having a multiple sub-via structure (e.g., dual electrode), whereas via 235 is shown having a single electrode structure. Variations to any region/component are possible, and may be varied in view of concerns for processing/fabrication.

First region contact 214 and second region contact 224 may have higher implantation concentration than the first region 210 and second region 220, e.g., a concentration of $10^{20}$ ions per centimeter$^3$ or higher or other concentrations for ohmic contact with the vias 213, 223. Although not specifically shown in FIG. 2, the absorption region 232 may include a higher-doped region, e.g., an absorption region contact, for ohmic contact with the via 235.

Regions may be constructed using photolithography techniques on a silicon substrate 204 and, as shown for example in FIG. 2, surrounded by oxide 209 or other structural material to provide mechanical support to the regions. Silicon dioxide may serve as a dielectric which electrically insulates the regions. Additionally, a variety of compositions may be used as the dielectric, such as different oxides of silicon, having a difference in index of refraction compared to the other regions. In an example, regions may be resonators (e.g., microrings) optically isolated by the oxide 209.

Various methods of fabrication may be used to produce device 200. A BOX 208 layer may be implanted in substrate 204, or implanted in a Si region of a bulk silicon SOI wafer. First region 210 may be added based on N+ ion implantation, and second region 210 may be added based on P+ ion implantation. Second region contact 224 may be added based on N++ ion implantation, and first region contact 214 may be added based on P++ ion implantation. The second portion 238 of the multiplication region 230 may be disposed on the first portion 236, e.g., based on selective epitaxial growth (SEG) of 100 nm of Si. The absorption layer 232 may be disposed on the multiplication region 230, e.g., based on SEG of 100 nm of Ge or SiGe. The oxide 209 may be added, and an amorphous Si/field oxide open procedure may be performed to expose the absorption layer 232. Then an absorption region contact (not shown in FIG. 2) may be implanted in the absorption layer 232, based on P++ ion implantation. Finally, a backend of line processing may be performed, including metal deposit to form the vias 213, 235, 223 and the terminals 212, 234, and 222.

Prior to forming the resonance cavity (e.g., microring) comprised of the multiplication region 230 and absorption region 232, the first region 210 and second region 220 may be implanted in a shape complementary to the resonance cavity (e.g., concentric rings, one having a smaller diameter than the resonance cavity, and one having a larger diameter). Alternate geometries may be used for the regions, including other resonance cavity structures, such as racetrack resonator and a distributed feedback reflector structure, and alternate fabrication techniques may be used for example devices.

During operation, the absorption region 232 may absorb a photon 260 to generate electrical carriers (hole 262 and electron 264). The carriers are swept out of the absorption region 232 based on an absorption region electric field (not shown in FIG. 2), through the multiplication region 230, triggering avalanche multiplication to generate additional carriers to be collected by the first region 210 and the second region 220 based on the multiplication region electric field (not shown in FIG. 2). The device 200 may be biased to transport the carriers to the multiplication region based on the first terminal 212, second terminal 222, and/or third terminal 234. The device 200 also may be biased such that a high electric field causes avalanche multiplication gain in the multiplication region 230, based on the first terminal 212, second terminal 222, and/or third terminal 234.

The device 200 thus has high quantum efficiency with increased photocurrent, using a low power budget and taking advantage of a high quality factor Q and resonance effects to build up intensity in the resonance cavity (e.g., based on a microring structure). Device 200 also may be operated at a high bandwidth, due, e.g., to a low RC constant associated with the lack of overlap between the first region 210 and the second region 220 and reduced carrier travel related to the separation distance 250.

Figure 3:
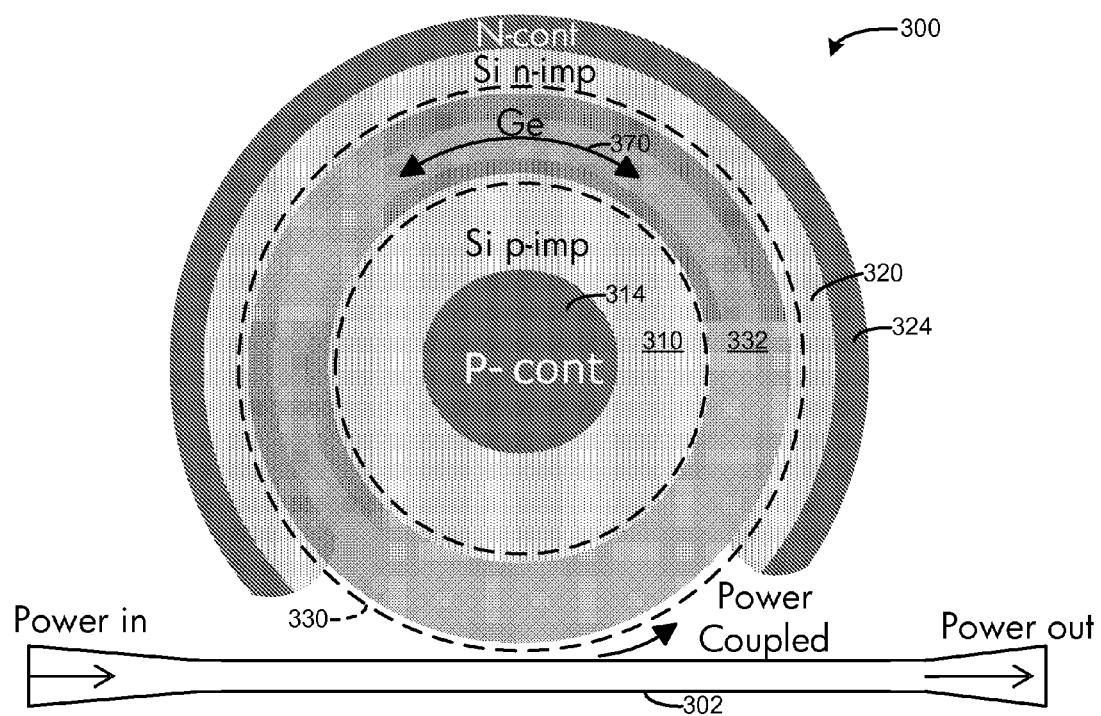
FIG. 3 is a top view block diagram of a ring-shaped device according to an example.

FIG. 3 is a top view block diagram of a ring-shaped device 300 according to an example. Device 300 includes a waveguide 302 (e.g., silicon or other light conducting material), and a ring-shaped (e.g., microring) resonance cavity, although other types and/or shapes may be used for resonance (e.g., a resonance cavity based on a Fabry Perot resonator, a Distributed Bragg Reflector (DBR), and other resonating elements). The device 300 also includes a first region 310, first region contact 314, multiplication region 330, absorption region 332, second region 320, and second region contact 324. The device 300 is associated with an optical absorption path 370. Additional elements may not be shown, for better visibility of the illustrated components. For example, device 300 is shown without terminals or other elements, to better reveal underlying elements that otherwise may be obscured by the terminals. In one example, the microring is between five and ten microns in diameter and about 200 nanometers in vertical height. This small geometric size leads to low capacitance and correspondingly high-speed capability for optical interconnects and other applications.

During operation, light can be critically coupled into the resonance cavity (e.g., into the absorption region 332) from the waveguide 302. Resonant enhancement may form at resonant wavelengths associated with the resonant cavity and/or wavelengths of light. The light may be absorbed at the absorption region 332 to generate electrical carriers. Absorption can occur along the optical absorption path 370 that may be curved, e.g., as light travels around the microring. Thus, the resonator structure enhances quantum efficiency. Optical energy within the waveguide can include a single frequency or a combination of optical frequencies, based on wavelengths from about 1.1 to 2 microns, for example.

The waveguide 302 can receive power in, and power can be coupled into the resonant cavity. The power coupled from the waveguide 302 is based on power that is internally dissipated by the resonant cavity (e.g., absorbed by the absorption region 332). Critical coupling occurs when all light in the waveguide 302 is coupled into the resonant cavity (e.g., power out is zero, an ideal situation). Coupling between the waveguide and resonant cavity can be controlled based on the separation between the edge of the waveguide 302 and an edge of the resonant cavity (e.g., a perimeter of the microring, or an edge of the multiplication region 330. Other geometries of the relation between the resonant cavity and the waveguide can provide coupling for energy transfer, e.g., vertical offset/overlap. The absorption region 332 and multiplication region 330 can have geometries to enhance coupling. For example, the absorption region 332 can be narrower than the multiplication region 330, such that the multiplication region 330 can extend further than the absorption region 332 toward the waveguide 302. The multiplication region 330 can extend outward to prevent other portions of the device 300 from contacting or approaching near the waveguide 302, such that coupling occurs with the multiplication region 330.

In the illustrated microring-based APD design of device 300, light at optical resonant wavelengths can travel multiple roundtrips along a circular path of the multiplication region 330. Hence, the effective length of the optical absorption path 370 can exceed linear dimensions of the device 300 (e.g., the path can be longer than a length, width, and/or height of device 300). The resonant cavity enhanced optical absorption path 370 enables more photo carriers to be generated for a given footprint of device 300, while dark current of device 300 remains low because dark current is not based on the increased effective length of the curved multi-round-trip optical absorption path 370, but rather the basic geometric shape/area of the absorption region 332. Therefore, high quantum efficiency and low dark current can be achieved. Furthermore, the increased effective length of the optical absorption path 370 enables a thin absorption region 332 having a relaxed tolerance for lower absorption coefficient materials, in contrast to other designs whose absorption depends on the linear geometric dimensions such as high absorption length/width/depth and high absorption coefficient of the material. Absorption of the device 300 based on a microring or other resonant enhancement structure depends more on coupling coefficient and quality factor (Q) of the microring, enabling a thin absorption region 332 of a material having a lower absorption coefficient and high Q. A thickness of the absorption region 332 may be chosen to avoid absorbing coupled light too quickly, to enable light to have multiple round trips and avoid being absorbed too soon. For example, an absorption region thickness of approximately 100 nm can provide beneficial results, although geometries/dimensions may be adjusted.

Example devices can be used for wave division multiplication (WDM) applications involving, e.g., multiple channels of different wavelengths. If different wavelengths of light are contained in the waveguide, each wavelength can be independently modulated without influencing the other wavelengths. The device 300 may be wavelength-selective to affect a particular wavelength or range of wavelengths. For example, the resonant cavity can resonate optical energy at a particular resonant wavelength or range of wavelengths. The absorption region 332 selectively may be more sensitive to light at a particular wavelength(s). Thus, multiple devices 300 may be associated with a waveguide 302 to utilize desired wavelengths. The device 300 may also provide a drop off filter function to filter a specific wavelength(s), e.g., to be received at a detector, without a need for a dedicated/separate filter component. With a high enough Q, device 300 can cover a narrow bandwidth for the drop off filter function. Thus, device 300 can combine a photodetector function and a drop off filter function into one device 300. Selectively interacting with light of specific wavelength(s) enables device 300 to have lower noise characteristics and be more resistant to interference from other optical frequencies. Wavelength selectivity of the device 300 may be varied and chosen based on design and implementation (e.g., region geometries etc.). It is also possible to adjust the resonant wavelength based on electrical tuning applied to the device 300 (e.g., electrically tuned resonance cavity).

The example microring APD shown in FIG. 3 may be built on a SOI substrate. The first region 310 and second region 320 may be implanted into the substrate as concentric rings. A blanket growth of Si buffer layer and Ge absorption layers are added to blanket the surface of the substrate. Microrings are subsequently defined in the blanket layer by an etching process, to form the ring-shaped multiplication region 330, and ring-shaped absorption region 332. The microring shape of the multiplication region 330 and absorption region 332 may be formed to overlap the separation distance between the first region 310 and second region 320, as shown in FIG. 3. Electrical contacts (first region contact 314, second region contact 324, and absorption region contact (not shown in FIG. 3)) are then defined on top of the Ge absorption layer 332 as well as the Si p- and n-first region 310 and second region 320. The silicon buffer layer (e.g., second portion of the multiplication region 330) is to reduce an optical leakage path between the absorption region 332 and waveguide, and is grown atop the substrate. The silicon buffer layer may be omitted, such that the absorption layer is grown directly onto the substrate.

Figure 4:
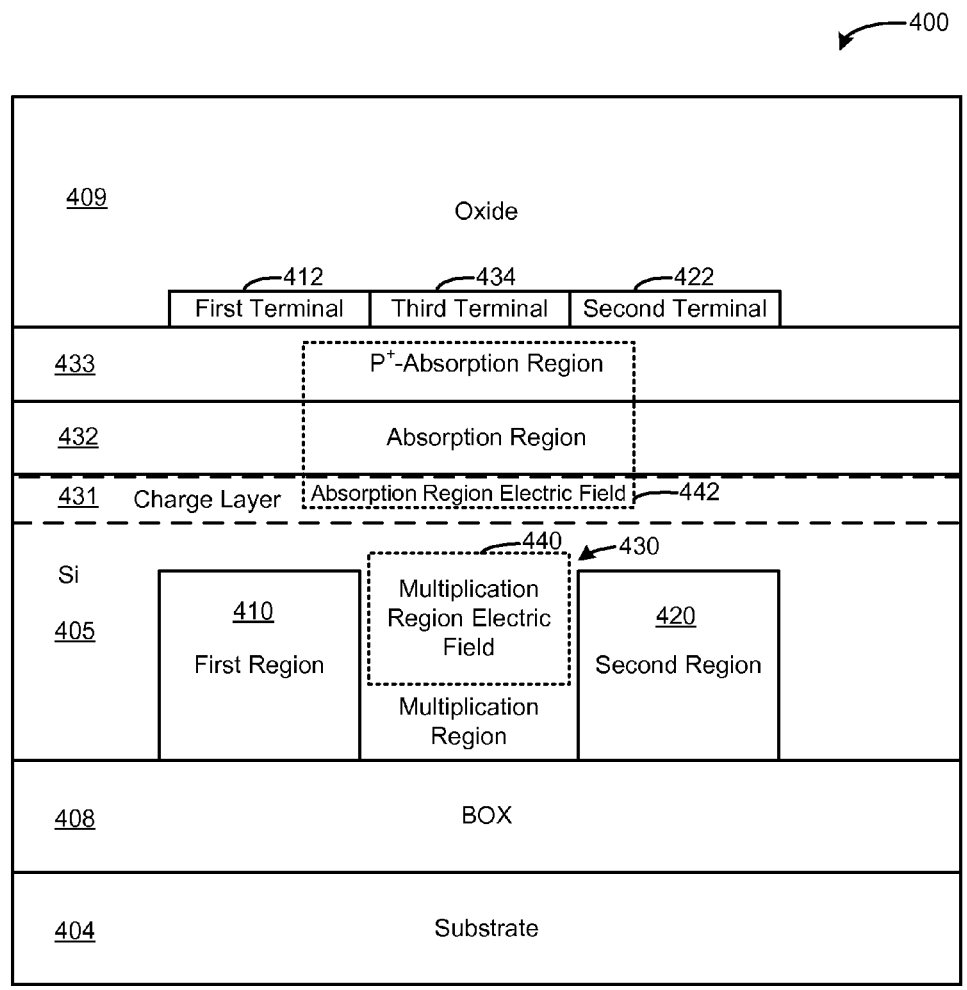
FIG. 4 is a side view block diagram of a device including a multiplication region according to an example.

FIG. 4 is a side view block diagram of a device 400 including a multiplication region 430 according to an example. Device 400 also includes substrate 404, BOX 408, silicon 405, first region 410, second region 420, absorption region 432, P+ absorption region 433, first terminal 412, second terminal 422, third terminal 434, and oxide 409. Device 400 also may include a charge layer 431, and in alternate examples may omit the charge layer 431. The multiplication region 430 is associated with a multiplication region electric field 440, and the absorption region 432 is associated with an absorption region electric field 442.

The charge layer 431 can be implanted between the absorption region 432 and the multiplication region 430, to confine the high electric field of the multiplication region electric field 440 within the Si of the multiplication region 430. Thus, the charge layer 431 is to inhibit the multiplication region electric field 440 from entering the absorption region 432, thereby avoiding impact ionization in the absorption region 432 material having a higher impact ionization coefficient (K-value), to thereby enable a high speed APD design to operate at higher bandwidths with less noise. Unlike the charge layer of a SACM structure device based on a strict and specific layered structure, the charge layer 431 is associated with relaxed fabrication techniques and easily implanted into the Si 405.

Figures 5A, 5B:
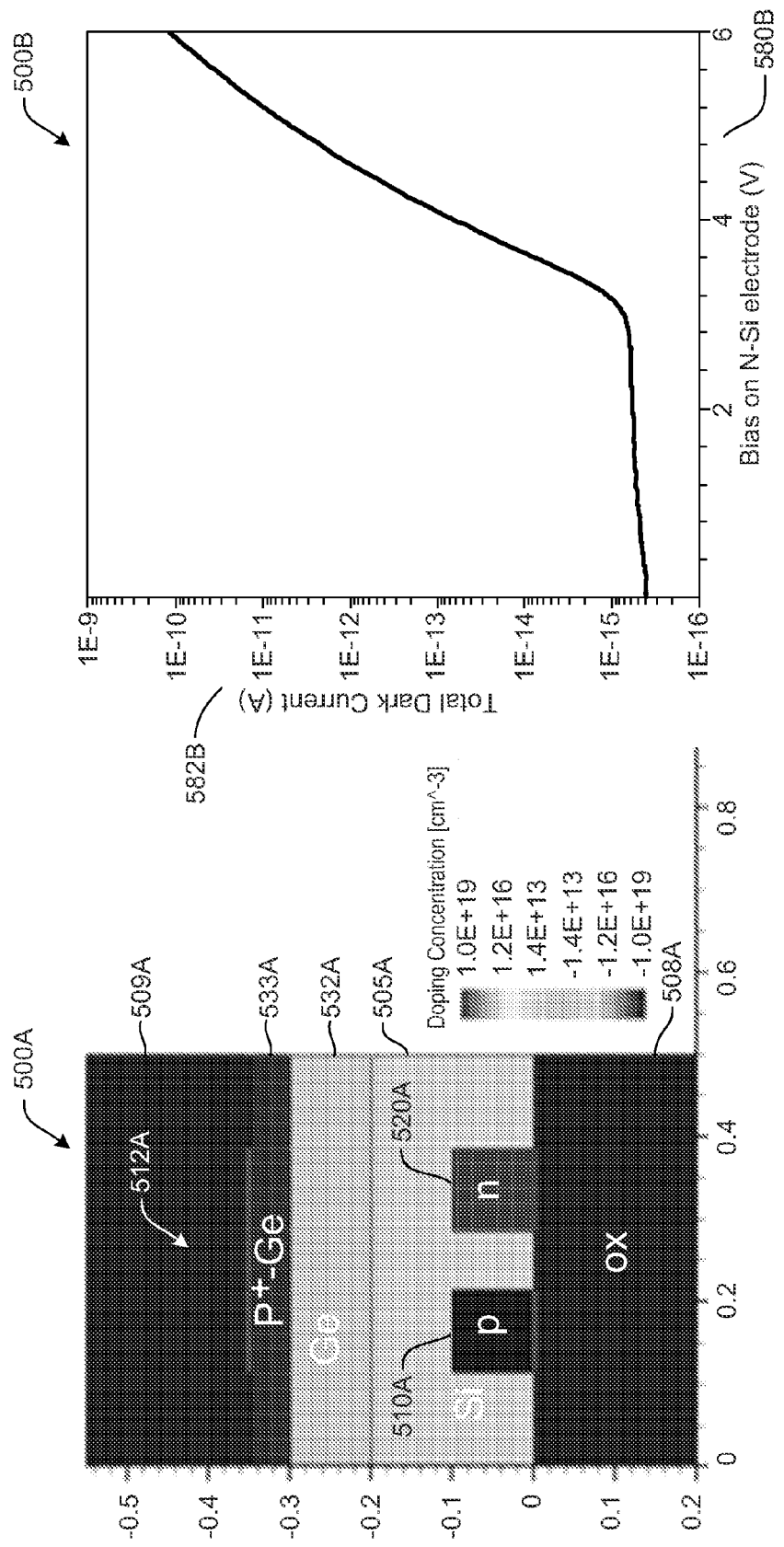
FIG. 5A is a side view block diagram of a device showing doping concentration according to an example.
FIG. 5B is a chart of dark current as a function of bias on N—Si electrode according to an example.

FIG. 5A is a side view block diagram of a device 500A showing doping concentration according to an example. Device 500A includes BOX 508A, silicon 505A, first region 510A, second region 520A, absorption region 532A, P+ absorption region 533A, terminals 512A, and oxide 509A.

Various example doping concentrations are visible based on the coloration of the various regions. For example, the doping concentrations are approximately as follows: Si region 505A~1.0 E+15 cm$^{-3}$ p-type, first region 510A~1.0 E+19 cm$^{-3}$ p-type, second region 520A~1.0 E+19 cm$^{-3}$ n-type, absorption region 532A~at intrinsic doping concentration (about 1.0 E+15 cm$^{-3}$), and P+ absorption region 533A~1.0 E+19 cm$^{-3}$ p-type. Doping concentrations, as well as various geometries, may be varied/adjusted in alternate examples.

FIG. 5B is a chart 500B of dark current 582B as a function of bias 580B on N—Si electrode according to an example. The N—Si electrode is also known as the second region 520A shown in FIG. 5A. The voltage on second region 520A is varied from 0 to 6 volts in the chart 500B, while the voltages on the first region 510A and the absorption region 532A are kept at zero based on the terminals 512A. As shown in the chart 500B, the total dark current remains low (~3 E−15 A) as the bias on the second region 520A is raised from 0V to approximately 3V before breakdown. At approximately 3V and above, the total dark current rises rapidly (e.g., close to breakdown around 4V and above). Thus, a relatively low bias on the electrodes (e.g., first region 510A, second region 520A, and/or other regions) is desirable to avoid dark current. The various examples described herein enable a low operational voltage to be used, resulting in low dark current.

FIGS. 5C-5F are side view block diagrams of a device showing electric field strength as a function of bias 580C-580F on n-Si according to an example. The field is shown ranging from a low value (e.g., 9.3 E−09) at the oxide above the P+ absorption region, to a high value (e.g., 1.3 E+06) at the area between the first region and second region. The evolution of the electric field is illustrated across FIGS. 5C-5F, by fixing VpGe and VpSi at 0V, and sweeping VnSi (580C, 580D, 580E, and 580F) from 0V to 3V (i.e., before breakdown in FIGS. 5C, 5D, and 5E) and again to 4V (close to breakdown in FIG. 5F).

Figure 6:
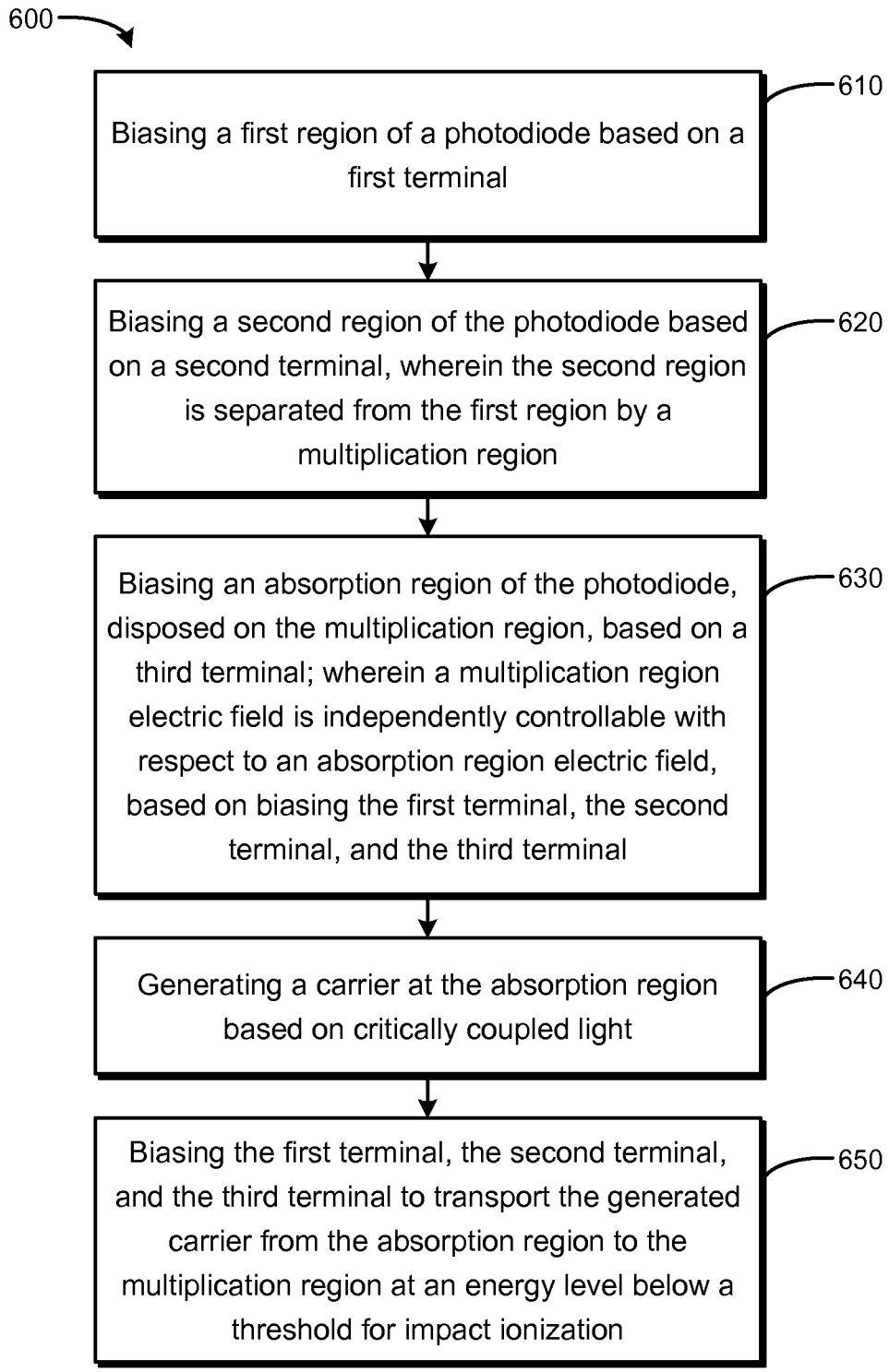
FIG. 6 is a flow chart based on biasing a photodiode according to an example.

FIG. 6 is a flow chart 600 based on biasing a photodiode according to an example. In block 610, a first region of a photodiode is biased based on a first terminal. In block 620, a second region of the photodiode is biased based on a second terminal, wherein the second region is separated from the first region by a multiplication region. In block 630, an absorption region of the photodiode, disposed on the multiplication region, is biased based on a third terminal; wherein a multiplication region electric field is independently controllable with respect to an absorption region electric field, based on biasing the first terminal and/or the second terminal. In block 640, a carrier is generated at the absorption region based on coupling light from a waveguide. In block 650, the first terminal, the second terminal, and the third terminal are biased to transport the generated carrier from the absorption region to the multiplication region at an energy level below a threshold for impact ionization.

What is claimed is:

1. A device comprising:
a first region associated with a first terminal;
a second region associated with a second terminal and separated, based on a separation distance, from the first region by a multiplication region; and
an absorption region disposed on the multiplication region and associated with a third terminal, wherein at least one edge of the absorption region does not overlap beyond an extent of the separation distance;
wherein a multiplication region electric field is independently controllable with respect to an absorption region electric field, based on the first terminal, the second terminal, and the third terminal.

2. The device of claim 1, wherein the multiplication region and absorption region are shaped as a resonance cavity to provide resonance enhancement and an optical absorption path along the resonance cavity having an effective length greater than linear dimensions of the device.

3. The device of claim 2, wherein the optical absorption path is to enable light absorption based on a plurality of round trips along the optical absorption path.

4. The device of claim 1, wherein the multiplication region electric field is to cause an amplified avalanche effect in the multiplication region based on a separation distance between the first region and the second region.

5. The device of claim 1, wherein the multiplication region is an undoped intrinsic material associated with an impact ionization coefficient.

6. The device of claim 1, wherein the first region, a first portion of the multiplication region, and the second region are disposed in a substrate as a waveguide resonance structure, and a second portion of the multiplication region is disposed on the substrate as a buffer layer.

7. The device of claim 6, wherein the absorption region and the second portion of the multiplication region are disposed on the first portion of the multiplication region.

8. The device of claim 1, further comprising a waveguide to critically couple light from the waveguide into the multiplication region based on a coupling coefficient, to form a resonant enhancement based on a resonant wavelength.

9. The device of claim 1, further comprising a charge layer disposed between the absorption region and the multiplication region to confine the multiplication region electric field to the multiplication region.

10. A resonant avalanche photodiode (APD) comprising:
    a silicon-on-insulator (SOI) substrate including a PIN junction based on a first region associated with a first terminal, an intrinsic silicon multiplication region, and a second region associated with a second terminal, wherein the intrinsic silicon multiplication region includes first and second portions, and wherein the second portion has a stepped geometry to affect optical mode confinement; and
    an absorption region disposed on the multiplication region and having a third terminal;
    wherein a multiplication region electric field is independently controllable with respect to an absorption region electric field, based on the first terminal, the second terminal, and the third terminal.

11. The APD of claim 10, wherein the absorption region is associated with a moderate absorption coefficient, and a multiplication region is substantially transparent to the coupled light based on a low optical absorption coefficient.

12. The APD of claim 10, wherein a multiplication region electric field is based on an avalanche breakdown voltage less than or equal to approximately 12 volts.

13. The APD of claim 10, wherein the multiplication region includes an intrinsic silicon buffer layer disposed on the SOI substrate.

14. A method, comprising:
    biasing a first region of a photodiode based on a first terminal that is spaced from the first region and electrically coupled to the first region using a first via;
    biasing a second region of the photodiode based on a second terminal, wherein the second region is separated from the first region by a multiplication region, and wherein the second terminal is spaced from the second region and electrically coupled to the second region using a second via; and
    biasing an absorption region of the photodiode, disposed on the multiplication region, based on a third terminal that is spaced from the absorption region and electrically coupled to the absorption region using a third via;
    wherein a multiplication region electric field is independently controllable with respect to an absorption region electric field, based on biasing the first terminal, the second terminal, and the third terminal.

15. The method of claim 14, further comprising generating a carrier at the absorption region based on critically coupled light, and biasing the first terminal, the second terminal, and the third terminal to transport the generated carrier from the absorption region to the multiplication region at an energy level below a threshold for impact ionization.

* * * * *